Figure 1A:
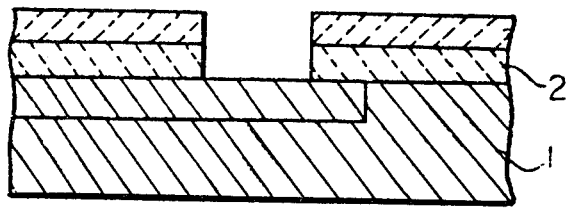

United States Patent [19]

Takai

[11] 3,953,266

[45] Apr. 27, 1976

[54] PROCESS FOR FABRICATING A SEMICONDUCTOR DEVICE

[76] Inventor: Toshio Takai, 6,269, Ayase Fukaya, Koza, Kanagawa, Japan

[22] Filed: Mar. 15, 1973

[21] Appl. No.: 341,757

Related U.S. Application Data

[63] Continuation of Ser. No. 874,317, Nov. 5, 1969, abandoned.

[30] Foreign Application Priority Data

Nov. 28, 1968  Japan.............................. 43-87122

[52] U.S. Cl.................................... 156/11; 29/578; 29/625; 156/13; 156/18; 204/32 R; 204/38 B; 204/192; 427/89; 427/91; 427/401
[51] Int. Cl.².......................... H05K 3/06; H05K 3/16
[58] Field of Search ........... 117/212, 221, 217, 218, 117/107, 71 R, 93.1 CD, 93 1 GD, 93.1 R, 93.31; 156/11, 17, 18, 13, 14; 317/234 (5.3); 29/578, 591, 625, 580; 148/189; 204/15, 23, 32 R, 32 S, 38 B, 46 G, 192

[56] References Cited

UNITED STATES PATENTS

| 2,566,615 | 9/1951 | Keilholtz et al........................ 156/18 |
| 3,193,418 | 7/1965 | Coorer et al.......................... 148/189 |
| 3,256,588 | 6/1966 | Sikina et al............................ 156/17 |
| 3,507,756 | 4/1970 | Wenger..................... 317/234 (5.3) |
| 3,657,029 | 4/1972 | Fuller................................... 156/18 |

OTHER PUBLICATIONS

Thomas et al., Electronics, Jan. 24, 1966, pp. 77-81.

Primary Examiner—Charles E. Van Horn
Assistant Examiner—Jerome W. Massie
Attorney, Agent, or Firm—Robert E. Burns; Emmanuel J. Lobato; Bruce L. Adams

[57] ABSTRACT

A method of fabricating a semiconductor composite comprises providing a semiconductor substrate having a platinum layer, masking the platinum layer with a chromium mask layer, applying a patterned photoresist layer over the chromium mask layer, etching away portions of the chromium mask layer in accordance with the pattern of the photoresist layer to accordingly pattern the chromium mask layer, then etching away portions of the platinum layer in accordance with the etched chromium layer, and finally removing the remaining portions of the chromium mask layer. The chromium layer is interposed between the platinum and photoresist layers due to its excellent adhesive compatibility with both the platinum and the photoresist layers and the presence of the chromium layer effectively prevents the etching solution for the platinum from penetrating between the platinum and photoresist layers.

8 Claims, 9 Drawing Figures

PROCESS FOR FABRICATING A SEMICONDUCTOR DEVICE

This is a continuation, of application Ser. No. 874,317, filed Nov. 5, 1969, now abandoned.

This invention relates to an improvement in a fabricating process of a semiconductor device, more particularly relates to a fabricating process for producing a planar-type semiconductor device wherein a thin platinum layer is readily capable of being etched away efficiently and accurately into a predetermined pattern.

Generally, in a fabricating process of a planar-type semiconductor device, a silicon dioxide ($SiO_2$) layer is first formed for passivation of the surface of a silicon wafer, wherein one or more transistors, diodes, resistors, capacitors etc. are contained, and then silicon nitride ($Si_3N_4$) is formed on the silicon oxide layer for the reinforcement thereof. These oxide and nitride layers are then removed from the selected areas by a photoresist process. Further, in general cases, the thin platinum layer is sputtered on the silicon wafer through the areas where the nitride and oxide are removed and the silicon wafer is subsequently heat treated to form a platinum silicide layer thereon. The above-mentioned platinum silicide layer is a part of an ohmic contact, whereby the increase of the contact ohmic resistance due to the direct deposition of a titanium layer on the silicon wafer can be prevented. The titanium layer has an excellent adhesiveness to the nitride and is formed by a sputtering and/or vacuum evaporation process. In order to prevent the undesirable reaction between the above-mentioned titanium layer and a gold beam lead, a thin platinum layer is sandwiched between them. The thin platinum layer is formed by a sputtering and/or vacuum evaporation process in the same manner as the titanium layer and subsequently etched out to the predetermined pattern by the photoresist process in the same manner as the titanium layer. A gold beam lead adheres on the thin platinum layer subsequent to an electroplating process of gold. In the well-known semiconductor device utilizing the above-described electrode construction, an advanced technique for etching the thin platinum layer is required due to the platinum layer having a poor binding force to the photoresist layer which is applied for masking a selected pattern by etching of the thin platinum layer (The above-mentioned pattern is referred to hereinafter as "masking pattern"). Further, the etching solution for platinum is a mixture of $HNO_3$ and $HCl$ and readily tends to penetrate into the contact area between the thin platinum layer and photoresist layer, thereby, the photoresist layer is released from a secured contact with the platinum layer and the thin platinum layer is distorted. Thus, in the conventional technique, the etching process of the thin platinum layer becomes troublesome, complicated and inefficient, and moreover, a reverse or back sputtering process is required for removing the platinum layer perfectly from the selected area. To carry out the aforesaid back sputtering process, it is required to set the semiconductor device again into the sputtering apparatus, however, the setting operation is considered troublesome. Further, a temperature rise in the wafer and a contamination by gold are observed during the reverse sputtering operation so that a uniform sputtering on the wafer is hardly achieved. Therefore, in order to eliminate the above-mentioned disadvantages, a thin layer of titanium or silicon dioxide is preferably deposited on the thin platinum layer as a masking pattern thereof and the etching of platinum from the selected areas is achieved in accordance with the above-described masking pattern.

However, even with the above-mentioned beam electrode construction, wherein the platinum and thin titanium layers are in a stratified condition, it is still necessary to protect the thin titanium layer from corrosion caused by sulfuric and fluoric acids used for removing the titanium and/or silicon dioxide layer by means of covering with a photoresist layer.

Also, the positioning of the masking pattern is required to be carried out with extreme accuracy. Therefore, in the above-mentioned conventional etching operation of the thin platinum layer, it is difficult to form such a fine pattern having a size of 4–6 microns. And, if the thickness of the platinum layer is larger than the conventional platinum layer thickness it is more difficult to etch the platinum layer accurately and completely, therefore, the operating efficiency of the process is lowered.

A principal object of the present invention is to provide an improved fabricating process for producing a planar-type semiconductor device eliminating the drawbacks of the above-mentioned conventional process. Other objects and features of the present invention will more fully appear from the following description with reference to the accompanying drawings and will be particularly pointed out in the claims.

FIGS. 1A to 1I show sequential steps of the planar process according to the present invention.

Figure 1B:
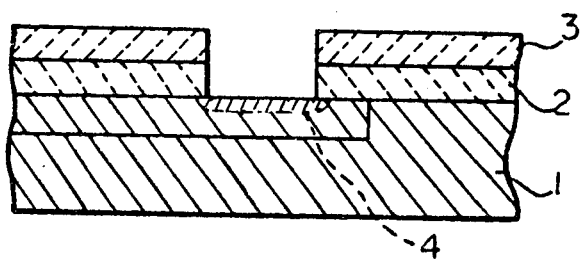
Figure 1C:
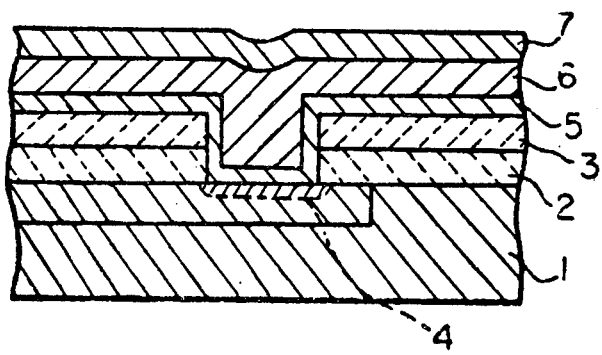
Figure 1D:
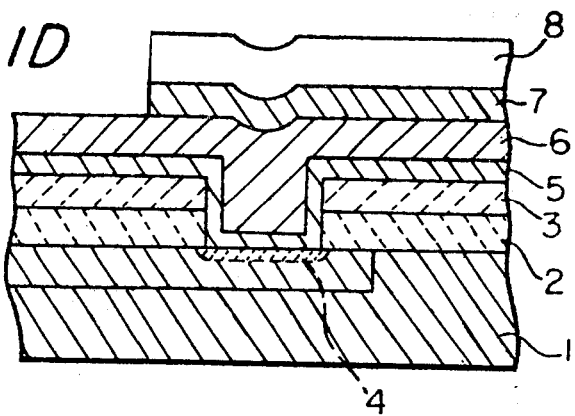

In the drawings, a silicon dioxide ($SiO_2$) layer 2 having a thickness of approximately 3000A is formed on a silicon wafer 1 to provide electric insulation by an oxidation process, and next, a silicon nitride ($Si_3N_4$) layer 3 is formed in a thickness of approximately 2000 A to reinforce the oxide layer 2 by application of a gaseous reaction of $SiH_4$ and $NH_3$. Superimposed selected areas of these oxide and nitride layers 2, 3 are removed from the selected areas, in preparation for the base diffusion, by a photoresist process as shown in FIG. 1A whereupon a semiconductor substrate is provided. Then, a platinum silicide ($Pt_5Si_2$) layer 4 is formed by depositing platinum in the selected area exposed by the previous process and then heat treating the deposited platinum and the silicon wafer 1 as shown in FIG. 1B in order to prevent the increase of contact ohmic resistance due to the direct deposition of titanium on the silicon wafer 1 which is carried out in a subsequent process. A titanium layer 5, a platinum layer 6 and a chromium masking layer 7 are deposited on the silicon wafer 1 as shown in FIG. 1C. The thickness of the titanium layer 5 is approximately 800 A and that of the platinum layer 6 is approximately 3000 A. The thickness of the thin chromium layer 7 is in a range from 1000 A to 5000 A, preferably in a range from 2000 A to 4000 A in accordance with the characteristics of the thin platinum layer and the etching conditions. From the inventor's experimental tests, it was found that the thickness of about 3000 A is most preferred for achieving the purpose of the present invention.

A patterned photoresist layer 8 is formed on the chromium layer 7. Then, a portion of the photoresist layer 8 is removed according to its pattern from a selected area of the chromium layer after sequential processes of pre-baking, positioning, exposition to ultraviolet rays, developing and post-baking, as shown in FIG.

Figure 1E:
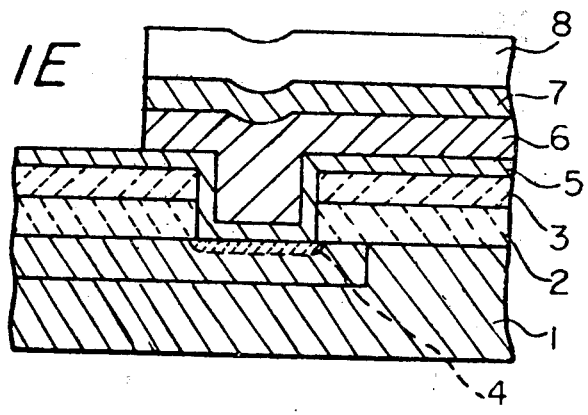

1D. Subsequently, the exposed area of the chromium layer 7 as defined by the masking pattern formed in the photoresist layer is etched away. The etching operation of the chromium layer 7 is carried out by heating an etching solution at 50°C for 15 sec. This etching solution is prepared by dissolving 20 g of KOH and 20 g of $KMnO_4$ in 400 cc of water. Thereafter, the wafer 1 is rinsed by ultrasonic vibration and post-baked at 200°C for 10 to 20 min. Next, the thin platinum layer 6 is etched away as defined by a masking pattern formed on the chromium layer 7 by utilizing an etching solution composed of a mixture of $HNO_3$ and HCl. The components' mixing ratio of the above-mentioned etching solution is defined as follows; $HNO_3 : HCl = 3 \sim 10 : 1$, and the etching operation is carried out at 90°C for 3 to 5 sec. as shown in FIG. 1E.

Figure 1F:
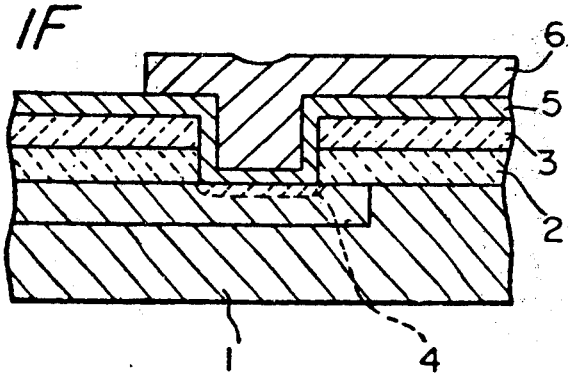
Figure 1G:
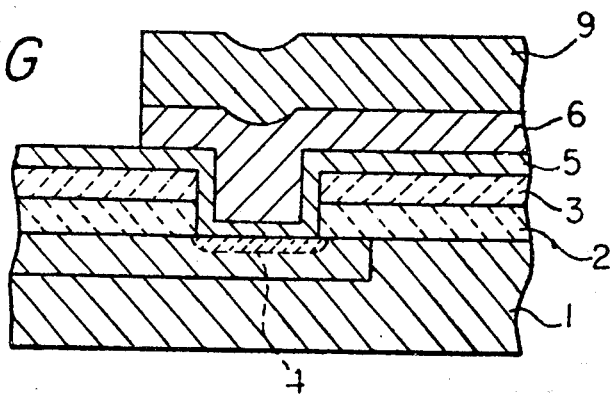
Figure 1H:
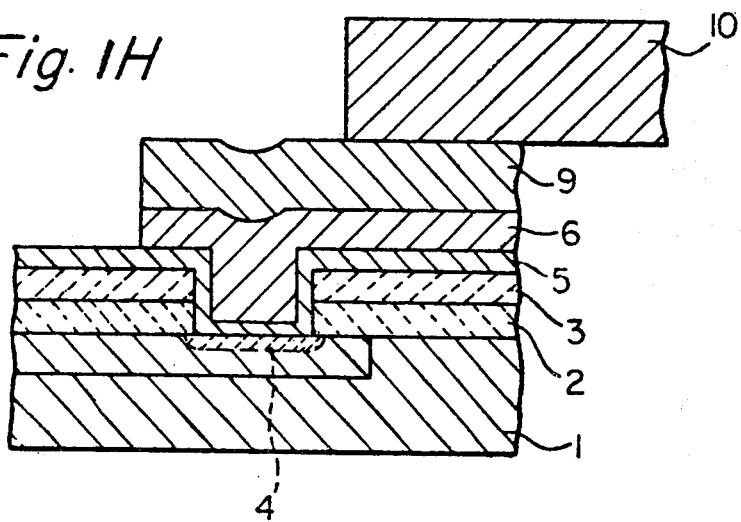
Figure 1I:
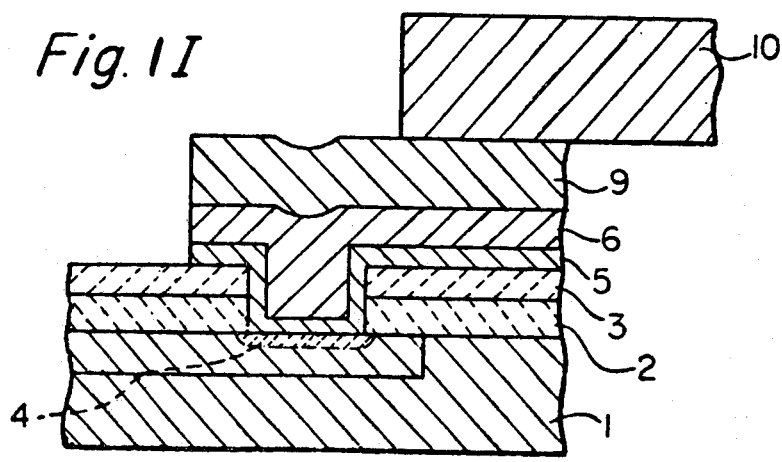

The most preferable mixing ratio of $HNO_3$ with HCl for carrying out the above-mentioned etching of the thin platinum layer 6 is 5 : 1. Then, the uppermost photoresist layer 8 is removed by utilizing a suitable removing reagent or stripper. The photoresist layer 8 may be removed after etching of the thin chromium layer 7 and prior to etching of the thin platinum layer 6. The photoresist layer 8 may be removed after etching of the thin chromium layer 7 and prior to etching of the thin platinum layer 6. Further, the rinsing of the thin chromium layer 7 is repeated by means of ultrasonic vibration, and the etching operation of the remaining thin chromium layer 7 used for the selected etching of the platinum layer 6 is carried out. The composition of the etching solution and operating conditions applied for dissolving of the remaining thin chromium layer 7 are quite equal to the above-mentioned composition of the etching solution and operating conditions for carrying out the selectional etching of the thin chromium layer 7 to produce the structure as shown in FIG. 1F. Then, the wafer 1 is subjected to a gold-electroplating operation so that a gold layer 9 having a thickness of approximately 2 microns is formed on the thin platinum layer 6 as shown in FIG. 1G. Further, a gold beam lead 10 is formed on the gold layer 9 by a succeeding electroplating process. The wafer 1 in this condition is shown in FIG. 1H. Finally, the exposed area of the titanium layer 5 is etched away and removed by means of applying sulfuric and hydrofluoric acids. The resulting wafer composite of this step is shown in FIG. 1I.

The characteristic features of the present invention are such that the adhesiveness between the photoresist 8 and the thin chromium layer 7 as well as that between the thin platinum layer 6 and the thin chromium layer 7 is so strong that the removal of the photoresist layer 8 from the thin chromium layer 7 as well as that of the thin chromium layer 7 from the thin platinum layer 6 very seldom occurs, and the etching away operation of the thin platinum layer 6 from the selected areas is carried out more completely and accurately owing to the passive behaviour of the thin chromium layer 7 in the mixed acid of $HNO_3$ and HCl. When the platinum layer is etched in the conventional manner wherein said platinum layer is directly masked only with the photoresist such as the KTFR, only a platinum layer having a thickness smaller than about 700 or 800 A can be successfully etched. In this case, the pattern to be formed on the platinum layer must be limited to certain larger dimensions. However, when the platinum layer is masked with the thin chromium layer, even when the width of the pattern is only approximately 10 microns, it is possible to successfully etch away the platinum layer having at most 1 micron thickness from the selected area and the mask layer cannot be peeled off from the platinum layer because the etching solution can only penetrate between the photoresist layer and the platinum by approximately 2 microns. When the pattern formed on the platinum layer has a width of 2 microns and the platinum layer has a thickness of 2000 A, no penetration of the etching solution is found. Further, if the concentration of the etching solution, the temperature and the etching duration during the etching operation are regulated more accurately and completely, further corrosion of the titanium layer can be prevented and a protective coating of the aforementioned thin titanium layer by a photoresist layer etc. can be omitted, thereby, a simplification of the fabricating process and raising of the production efficiency can be attained.

What is claimed is:
1. A process for producing a semiconductor composite comprising the steps of:
 a. providing a semiconductor substrate having on a surface portion thereof a layer of platinum formed on a layer of a titanium;
 b. masking said platinum layer with a mask layer of chromium;
 c. masking a portion of said chromium mask layer with a layer of photoresist patterned in accordance with a predetermined pattern;
 d. selectively etching away only the non-masked portion of said chromium mask layer so that the masked portion of said chromium mask layer remains on said platinum layer;
 e. then, selectively etching away only the portion of said platinum layer not masked by the chromium mask layer remaining on the platinum layer, so that the mask portion of said platinum layer remains on said titanium layer;
 f. completely removing said photoresist mask layer subsequent to the aforesaid step (d);
 g. completely removing said chromium mask layer remaining on said platinum layer subsequent to the removal of the photoresist layer;
 h. forming a layer of gold on said portion of said platinum layer remaining on said titanium layer by gold-electroplating;
 i. forming a gold beam lead on said gold layer by gold-electroplating, and then
 j. selectively etching away said titanium layer in accordance with the pattern of said gold layer on said platinum layer.

2. A process according to claim 1 wherein the thickness of said chromium mask layer is from 1000 to 5000 A.

3. A process according to claim 2, wherein the thickness of said chromium mask layer is from 2000 to 4000 A.

4. A process according to claim 1, wherein said first-mentioned etching step is carried out using a mixed aqueous solution of KOH and $KMnO_4$.

5. A process according to claim 1, wherein said second-mentioned etching step is carried out using a mixture of $HNO_3$ and HCl.

6. A process according to claim 1 wherein said masking step is achieved by a sputtering method.

7. A process according to claim 1, wherein said masking step is achieved by a vacuum evaporation method.

8. A process according to claim 1, wherein completely removing said photoresist layer is subsequent to the etching step (e).

* * * * *